United States Patent [19]
Okuda et al.

[11] Patent Number: 6,080,286
[45] Date of Patent: Jun. 27, 2000

[54] SPUTTERING METHOD AND APPARATUS USING A TRIGGER GAS FEED

[75] Inventors: Akira Okuda, Sakai; Masahide Yokoyama, Hirakata; Hiroshi Hayata, Katano, all of Japan

[73] Assignee: Matsushita Electric Industrial Co., Osaka-fu, Japan

[21] Appl. No.: 08/917,478

[22] Filed: Aug. 26, 1997

[30] Foreign Application Priority Data

Aug. 28, 1996 [JP] Japan ................................... 8-226512

[51] Int. Cl.$^7$ .................................................. C23C 14/34
[52] U.S. Cl. ............................ 204/192.13; 204/192.12; 204/298.03; 204/298.07; 204/298.08
[58] Field of Search ........................ 204/192.12, 192.13, 204/298.03, 298.07, 298.08

[56] References Cited

U.S. PATENT DOCUMENTS

| | | | |
|---|---|---|---|
| 4,172,020 | 10/1979 | Tisone et al. ....................... | 204/129.13 |
| 4,283,260 | 8/1981 | Thomas et al. .................... | 204/192.12 |
| 4,428,812 | 1/1984 | Sproul ................................ | 204/298.07 |
| 4,440,618 | 4/1984 | Suzuki et al. . | |
| 5,049,251 | 9/1991 | Inoue ................................. | 204/298.07 |
| 5,082,545 | 1/1992 | Tanaka et al. . | |
| 5,322,605 | 6/1994 | Yamanishi . | |

FOREIGN PATENT DOCUMENTS 2-43867  11/1990  Japan .

*Primary Examiner*—Nam Nguyen
*Assistant Examiner*—Gregg Cantelmo
*Attorney, Agent, or Firm*—Wenderoth, Lind & Ponack, L.L.P.

[57] ABSTRACT

A trigger gas feed system is normally kept opened before a discharge is started. The trigger gas feed system is shut instantaneously, for example, when the discharge is generated, thereby to set a vacuum chamber at a sputtering pressure. The trigger gas feed system is opened again after the discharge is finished. The opened state is continued until another discharge is started. Accordingly, the pressure in the vacuum chamber before the discharge is maintained always constant, and the vacuum chamber is returned to the sputtering pressure in a short time.

20 Claims, 6 Drawing Sheets

SPUTTERING METHOD AND APPARATUS USING A TRIGGER GAS FEED

BACKGROUND OF THE INVENTION

The present invention relates to a sputtering method and a sputtering apparatus for forming metallic films, insulating films or the like on substrates. For example, the present invention can be applied to a magnetic head such as GMR (Giant Magneto-Resistive element) including, for example, Cu films and Ni—Fe—Co films alternately located between a passivation film and a substrate.

Sputtering has been often carried out to form thin films of semiconductor, optical disks, electronic components, etc. in these days.

Hereinbelow, an example of a conventional sputtering method (for example, which is disclosed in Japanese Examined Utility Model Publication No. 2-43867) will be described with reference to FIGS. 6 and 7. In FIG. 6, reference numerals 1–3 represent a target, a cathode equipped with the target 1, and a substrate arranged opposite to the cathode 2 to which a film is to be formed by sputtering, respectively. Other reference numerals are: 4 a vacuum discharge pump for achieving a vacuum atmosphere in a vacuum chamber 5; 6 a gas feed system for supplying a sputtering gas to the vacuum chamber 5 while regulating a flow rate of the gas thereby to make a pressure in the vacuum chamber 5 to be a sputtering pressure; 7 a trigger gas feed system for triggering a discharge gas; 8 a pressure regulation valve for regulating the pressure in the vacuum chamber 5; 9 a power source for supplying electricity to the cathode 2 to generate plasma at a surface of the target 1, respectively.

The operation of a sputtering apparatus constituted as above will now be described. First, the interior of the vacuum chamber 5 is vacuumized into the order of $10^{-6}$ Torr by the vacuum discharge pump 4. Argon gas is then introduced into the vacuum chamber 5 by the gas feed system 6. The vacuum chamber 5 is adjusted to be a pressure of $2\times10^{-3}$ Torr or so as a sputtering pressure, and then the pressure regulation valve 8 is fixed. The substrate 3 is set in the vacuum chamber 5 through a vacuum atmosphere reserve chamber or a transfer chamber, etc. Thereafter, as shown in FIG. 7, a direct current power source or a high frequency power source 9 is turned ON at a timing T11 thereby to apply electricity to the cathode 2. At the same timing, the trigger gas feed system 7 is opened to raise the pressure in the vacuum chamber 5 to be higher than the sputtering pressure, which brings about a discharge in the vacuum chamber 5. At a timing T12 when the discharge is detected by a discharge detection sensor such as a photo-detector or the like (when the discharge detection sensor is turned ON), the trigger gas feed system 7 is closed, so that the vacuum chamber 5 is returned to the sputtering pressure.. A film is thus formed on the substrate 3. In this case, the electricity applied to the cathode 2 reaches a set power at a timing T13. The direct current power source or high frequency power source 9 is turned OFF at a timing T15 when a film formation time terminates. The discharge is stopped. The discharge detection sensor is turned OFF at this time, that is, in a state not to detect the discharge. Then, the substrate 3 is transferred to the reserve chamber or transfer chamber or the like, and a fresh substrate 3 is set in the vacuum chamber 5. After the substrates 3 are transferred, the vacuum chamber 5 is returned to approximately $2\times10^{-3}$ Torr as the sputtering pressure at a timing T16, and at the timing T16, the direct current power source or high frequency power source 9 is turned ON to supply electricity to the cathode 2. The trigger gas feed system 7 is opened at the same timing to make the pressure in the vacuum chamber 5 higher than the sputtering pressure. As a result, a discharge is brought about in the vacuum chamber 5. The trigger gas feed system 7 is closed at a timing T17 when the discharge detection sensor such as a photo-detector detects the discharge (is turned ON). The vacuum chamber is consequently returned to the sputtering pressure and a film is formed on the substrate 3. The electricity applied to the cathode 2 at this time reaches the set power at a timing T18. The discharge is stopped with the direct current power source or high frequency power source 9 being shut at a timing T20 when the film formation time expires. The discharge detection sensor is turned into a state not to detect discharging (is turned OFF). The substrate 3 is moved to the reserve chamber or transfer chamber, etc. in the vacuum atmosphere and a fresh substrate 3 is sent in the vacuum chamber 5. The above operation is repeatedly carried out afterwards. A pressure change when the substrate is exchanged to the reserve chamber or transfer chamber, etc. is not indicated in FIG. 7.

According to the above sputtering method, since the gas remains in the trigger gas feed system 7 while the trigger gas feed system 7 is closed, the gas is abruptly supplied at a moment when the trigger gas feed system 7 is opened at the timing T11. Therefore, the vacuum chamber 5 assumes $1\times10^{-1}$ Torr or higher pressure, as shown in FIG. 7, which raises the necessity of a long time to reach a timing T14 when the vacuum chamber 5 returns to the sputtering pressure. An interface of the film to the substrate 3 becomes thick because of the higher pressure than the original sputtering pressure. Moreover, since a film formation speed generally decreases in a high pressure state, the film is formed virtually at a low speed as a whole. A change in time interval of discharges because of the exchange of substrates 3, etc. changes the amount of gas stagnation in the trigger gas feed system 7. That is, the pressure in the vacuum chamber 5 rises unstably when the trigger gas feed system 7 is opened, thereby rendering the timing T14 instable for the vacuum chamber 5 to return to the sputtering pressure. In addition, the pressure and electricity for starting the discharge vary due to a large pressure increase, in other words, the timing T12 starting the discharge becomes instable. As a result of this, a discharge duration (film formation time) varies, which leads to an instable film thickness. Besides, the film quality at the interface is instable. The conventional sputtering method has many issues as above.

In the case of sputtering to optical disks or the like, films have been formed in a short time, namely, in units of seconds. The aforementioned change in film quality and film thickness causes defective products and lowers a yield. For example, if the absolute value of the thickness of the film is unstable, the reflectance may make unstable to cause the signal strength to vary and thus the disk characteristics is lost and stored information can not be read out, and the step coverage may change not to recognize pits, and the heat conduction may change to change crystal condition. Additionally, if a film is formed in a case where the initial pressure is too high, the adhesive force of the film may be weaken and the refractive index may be adversely changed. Although a thermal filament method or the like is executed in many cases to trigger the discharge, the method requires a filament mechanism, a power source for a filament current and the like, making facilities complicate and expensive.

SUMMARY OF THE INVENTION

An object of the present invention is to provide a sputtering method and a sputtering apparatus using triggering of a discharge gas, whereby a pressure in a vacuum chamber before a discharge is started is kept constant at all times, so that a time for the vacuum chamber to return to a sputtering pressure is reduced, thereby to greatly stabilize a film thickness and film quality and improve a film formation speed.

In accomplishing these and other aspects, according to a first aspect of the present invention, there is provided a sputtering method in which, on occasion of a sputtering discharge, a flow rate of a discharge gas is increased to raise a vacuum chamber to be higher than a sputtering pressure, the method comprising: opening a trigger gas feed system to increase the flow rate of the discharge gas to raise the vacuum chamber to be higher than the sputtering pressure before the discharge is started; closing the trigger gas feed system instantaneously when the discharge is brought about, thereby setting the vacuum chamber at the sputtering pressure; and opening the trigger gas feed system again after the discharge is finished.

According to a second aspect of the present invention, there is provided a sputtering method according to the first aspect, wherein the trigger gas feed system is opened again after the discharge is finished, and kept opened until a next discharge is started.

According to a third aspect of the present invention, there is provided a sputtering method according to the first or second aspect, wherein in opening the trigger gas feed system to increase the flow rate of the discharge gas to raise the vacuum chamber to be higher than the sputtering pressure, the trigger gas feed system is opened to increase the flow rate of the discharge gas before the discharge is detected, instead of before the discharge is started; and in closing the trigger gas feed system, the trigger gas feed system is closed after the discharge is detected, instead of instantaneously when the discharge is brought about.

According to a fourth aspect of the present invention, there is provided a sputtering method according to the first or second aspect, wherein in opening the trigger gas feed system to increase the flow rate of the discharge gas to raise the vacuum chamber to be higher than the sputtering pressure, the trigger gas feed system is opened to increase the flow rate of the discharge gas before a power value of a discharge power source reaches a predetermined value not larger than a discharge power value, instead of before the discharge is started; and in closing the trigger gas feed system, the trigger gas feed system is closed when the power of the discharge power source reaches the predetermined value not larger than the discharge power, instead of instantaneously when the discharge is brought about.

According to a fifth aspect of the present invention, there is provided a sputtering method according to the first or second aspect, wherein in opening the trigger gas feed system to increase the flow rate of the discharge gas to raise the vacuum chamber to be higher than the sputtering pressure, the trigger gas feed system is opened to increase the flow rate of the discharge gas before a discharge power source is turned ON, instead of before the discharge is started; and in closing the trigger gas feed system, the trigger gas feed system is closed after the discharge power source is turned ON, instead of instantaneously when the discharge is brought about.

According to a sixth aspect of the present invention, there is provided a sputtering apparatus for forming a film by sputtering wherein, on occasion of a sputtering discharge, a flow rate of a discharge gas is increased to raise a vacuum chamber to be higher than a sputtering pressure, the apparatus comprising: a trigger gas feed system for supplying the discharge gas into the vacuum chamber; and a control device which can control opening/closing of the trigger gas feed system, so as to open the trigger gas feed system so as to increase the flow rate of the discharge gas to raise the vacuum chamber to be higher than the sputtering pressure before the discharge is started, close the trigger gas feed system to return the vacuum chamber to the sputtering pressure instantaneously when the discharge is brought about, and open the trigger gas feed system again after the discharge is finished.

According to a seventh aspect of the present invention, there is provided a sputtering apparatus according to the sixth aspect, wherein the control device opens the trigger gas feed system again after the discharge is finished and keeps the trigger gas feed system in an opened state until a next discharge is started.

According to an eighth aspect of the present invention, there is provided a sputtering apparatus according to the sixth or seventh, which is further provided with a discharge detection sensor for detecting the discharge in the vacuum chamber, whereby the control device opens the trigger gas feed system so as to increase the flow rate of the discharge gas to raise the vacuum chamber to be higher than the sputtering pressure before the discharge is detected, not before the discharge is started, and closes the trigger gas feed system after the discharge detection sensor detects the discharge, not instantaneously when the discharge is brought about.

According to a ninth aspect of the present invention, there is provided a sputtering apparatus according to the sixth or seventh, wherein the control device receives a power value of a discharge power source and opens the trigger gas feed system so as to increase the flow rate of the discharge gas to raise the vacuum chamber to be higher than the sputtering pressure before the power value of the discharge power source input thereto reaches a predetermined value not larger than a discharge power value, not before the discharge is started, and closes the trigger gas feed system when the power value of the discharge power source reaches the predetermined value not larger than the discharge power, not instantaneously when the discharge is brought about.

According to a tenth aspect of the present invention, there is provided a sputtering apparatus according to the sixth or seventh, wherein the control device opens the trigger gas feed system so as to increase the flow rate of the discharge gas to raise the vacuum chamber to be higher than the sputtering pressure before the discharge power source is turned ON, not before the discharge is started, and closes the trigger gas feed system after the discharge power source is turned ON, not instantaneously when the discharge is brought about.

According to the present invention, since the trigger gas feed system is fundamentally kept opened except during the discharge, the gas is not left in the trigger gas feed system, and accordingly the pressure in the vacuum chamber before the discharge is started is always constant. Moreover, since the pressure of the vacuum chamber before the discharge is started with the trigger gas feed system being opened is reduced to be close to a lowest limit discharge pressure, the time to return to the sputtering pressure is shortened. Owing to the above, the timing of the start of the discharge is stabilized thereby to stabilize the film formation time, and the time for the vacuum chamber to return to the sputtering pressure is shortened thereby to stabilize the sputtering pressure on the film formation occasion. Accordingly, the film thickness and film quality are stabilized. Furthermore, the quality of the film at the interface to the substrate is stabilized, a thickness of the film formed by the higher pressure than the sputtering pressure is decreased, and the film formation speed is improved.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
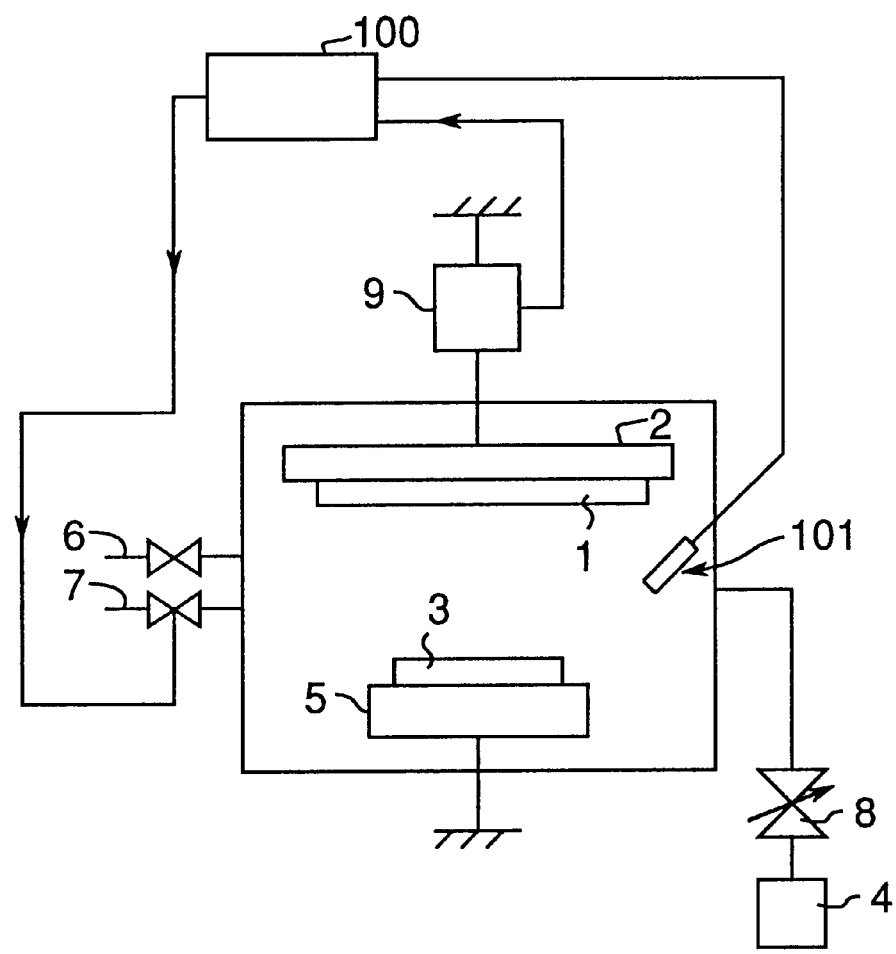
FIG. 1 is a schematic diagram of an apparatus for executing a sputtering method according to a first embodiment of the present invention.

Before the description of the present invention proceeds, it is to be noted that like parts are designated by like reference numerals throughout the accompanying drawings.

Embodiments of the present invention will be described with reference to the drawings.

Figure 2:
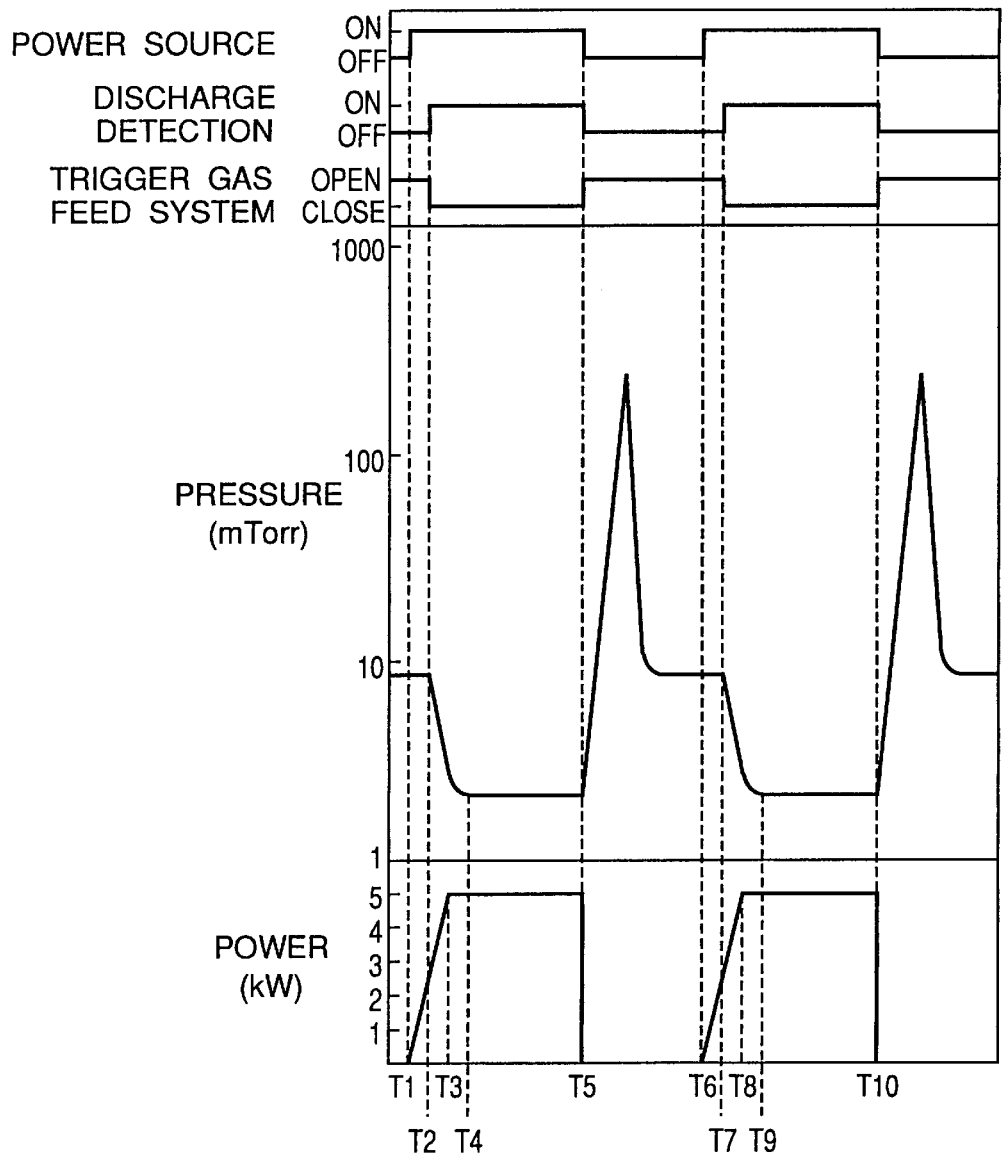
FIG. 2 is a timing chart in a sputtering process of the sputtering method in the first embodiment of FIG. 1.

An apparatus for executing a sputtering method in a first embodiment of the present invention is shown in FIGS. 1 and 2. The apparatus according to the first embodiment increases a flow rate of a discharge gas in sputtering discharge thereby to increase a pressure in a vacuum chamber to be higher than a sputtering pressure, whereby a discharge is brought about to form a film for an optical disk (for example, film for recording in CD or DVD or magnetic film etc., for 5 seconds etc.) by sputtering (denoted as "triggering of a discharge gas" hereinbelow). In the sputtering apparatus, before the discharge is started, a gas feed system for increasing the flow rate of the discharge gas thereby to increase the pressure in the vacuum chamber to be higher than the sputtering pressure (referred to as "a trigger gas feed system" below) is always opened. The trigger gas feed system is closed instantaneously when the discharge is given rise to, whereby the vacuum chamber is returned to the sputtering pressure. Upon completion of the discharge, the trigger gas feed system is opened again, which is maintained until another discharge is started. According to this first embodiment, since the pressure before the discharge is started is kept constant at all times to shorten a time for the vacuum chamber to return to the sputtering pressure, a film thickness and film quality are greatly stabilized and further a film formation speed is improved.

The above first embodiment will be described more in detail with reference to FIGS. 1 and 2.

FIG. 1 shows the sputtering apparatus in the first embodiment. FIG. 2 is a timing chart of procedures in a sputtering process in the apparatus. The sputtering apparatus is schematically constructed the same as depicted in conjunction with the prior art, and therefore the same parts will be designated by the same reference numerals, the description of which will be omitted here.

A large difference of the apparatus of the first embodiment from the conventional one is that a control device 100 is provided for controlling opening/closing of the trigger gas feed system 7 based on whether a discharge detection sensor 101 such as a photo-detector detects the discharge (is turned ON or OFF). More specifically, when the discharge detection sensor 101 is in a state not to detect a discharge, the control device 100 keeps open the trigger gas feed system 7 before the discharge is started, thereby increasing the flow rate of the discharge gas and raising the pressure in the vacuum chamber 5 to be higher than the sputtering pressure. Further, the control device brings the trigger gas feed system 7 into a closed state when the discharge detection sensor 101 detects the discharge or immediately when the discharge is generated, thereby returning the vacuum chamber 5 to the sputtering pressure. The control device opens the trigger gas feed system 7 again when the discharge is finished, that is, when the discharge detection sensor 101 comes not to detect the discharge and, the control device also maintains the opened state until the discharge detection sensor 101 detects the discharge again, i.e., when the discharge is started again. The control device 100 operates in this manner.

The operation of the sputtering apparatus using the control device 100 will be described. The vacuum chamber 5 is vacuumized to a degree of vacuum of $10^{-6}$ Torr by the vacuum discharge pump 4. Then, argon gas is fed into the vacuum chamber 5 via the gas feed system 6 and, the interior of the vacuum chamber is adjusted to be approximately the sputtering pressure, namely, $2 \times 10^{-3}$ Torr by the pressure regulation valve 8. The pressure regulation valve 8 is fixed at this time. The trigger gas feed system 7 is opened under the control of the control device 100. A flow rate of the argon gas is fixed to achieve a limit pressure for bringing about an initial discharge, e.g., $9 \times 10^{-3}$ Torr as shown in FIG. 2. The argon gas is introduced in the vacuum chamber 5 in this state. A substrate 3 is set in the vacuum chamber 5 through a vacuum atmosphere reserve chamber, transfer chamber or the like. Subsequently, a direct current power source or high frequency power source 9 is turned ON at a timing T1 as indicated in FIG. 2, applying electricity to the cathode 2 thereby bringing about a discharge. At a timing T2 when the discharge detection sensor 101 such as a photo-detector or the like detects the discharge (when the sensor is turned ON), the trigger gas feed system 7 is closed under the control of the control device 100 to return the vacuum chamber to the sputtering pressure, whereby a film is formed on the substrate 3. At this time, the vacuum chamber 5 returns to the sputtering pressure at a timing T4 and the power applied to the cathode 2 reaches a set power at a timing T3. The direct current power source or high frequency power source 9 is turned OFF at a timing T5 when a film formation time terminates. The discharge is stopped. The discharge detection sensor 101 at this time comes not to detect the discharge (is turned OFF). At the same timing T5, the trigger gas feed system 7 is opened under the control of the control device 100. The substrate 3 in the vacuum chamber 5 is transferred to the vacuum atmosphere reserve chamber, transfer chamber or the like from in the vacuum chamber 5. On the other hand, a fresh substrate 3 is set in the vacuum chamber 5 from the vacuum atmosphere reserve or transfer chamber or the like. After the substrates 3 are transferred and the vacuum chamber 5 is raised to the limit pressure $9 \times 10^{-3}$ Torr or so inspiring an initial discharge, the direct current power source or high frequency power source 9 is turned ON to apply the electricity to the cathode 2 at a timing T6, resulting in the generation of a next discharge. At a timing T7 when the discharge detection sensor 101 such as a photo-detector or the like detects the discharge (is turned ON), the trigger gas feed system 7 is closed by the control of the control device 100 thereby to return the vacuum chamber to the sputtering pressure. A film is thus formed on the substrate 3. At this time, the vacuum chamber is returned to the sputtering pressure at a timing T9 and the power applied to the cathode 2 reaches the set power at a timing T8. At a timing T10 when the film formation time ends, the direct current power source or high frequency power source 9 is turned OFF, with the discharge stopped. The discharge detection sensor 101 is turned OFF at this time into a state not detecting the discharge. At the same timing T10, the trigger gas feed system 7 is opened under the control by the control device 100, and the substrate 3 in the vacuum chamber 5 is carried to the vacuum atmosphere reserve chamber or transfer chamber, etc., while a fresh substrate 3 is sent out and set in the vacuum chamber 5 through the vacuum atmosphere reserve or transfer chamber, etc. A sequence of operations is repeated thereafter. In FIG. 2, a pressure change because of the exchange of substrates in the reserve chamber or transfer chamber, etc. is not indicated.

As described hereinabove, according to the present invention, the trigger gas feed system 7 is kept opened at all times except during the discharge under the control by the control device 100, thereby eliminating the stagnation of gas in the trigger gas feed system 7. The pressure in the vacuum chamber 5 before the occurrence of the discharge is accordingly maintained always constant. Since the pressure in the vacuum chamber 5 before the start of the discharge with the trigger gas feed system 7 opened is reduced to a value close to the lowest limit pressure required for the generation of the discharge, the time to return to the sputtering pressure is shortened. In consequence, the timing T2 starting the discharge is stabilized, thereby stabilizing the film formation time, and the short time for the vacuum chamber to return to the sputtering pressure stabilizes the sputtering pressure at the film formation occasion, making the film thickness and film quality stable. For example, although the stability of the thickness is ±5–6% or less in the conventional method, the stability of the thickness is ±3% or less in the embodiment. Furthermore, the quality of the film at the interface to the substrate 3 is stabilized, the thickness of the film formed with the higher pressure than the sputtering pressure is decreased, and the film formation speed is improved. For example, although the time to return to the film formation pressure is 3 seconds in the conventional method, the time to return to the film formation pressure is 1–1.5 seconds in the embodiment.

Figure 3:
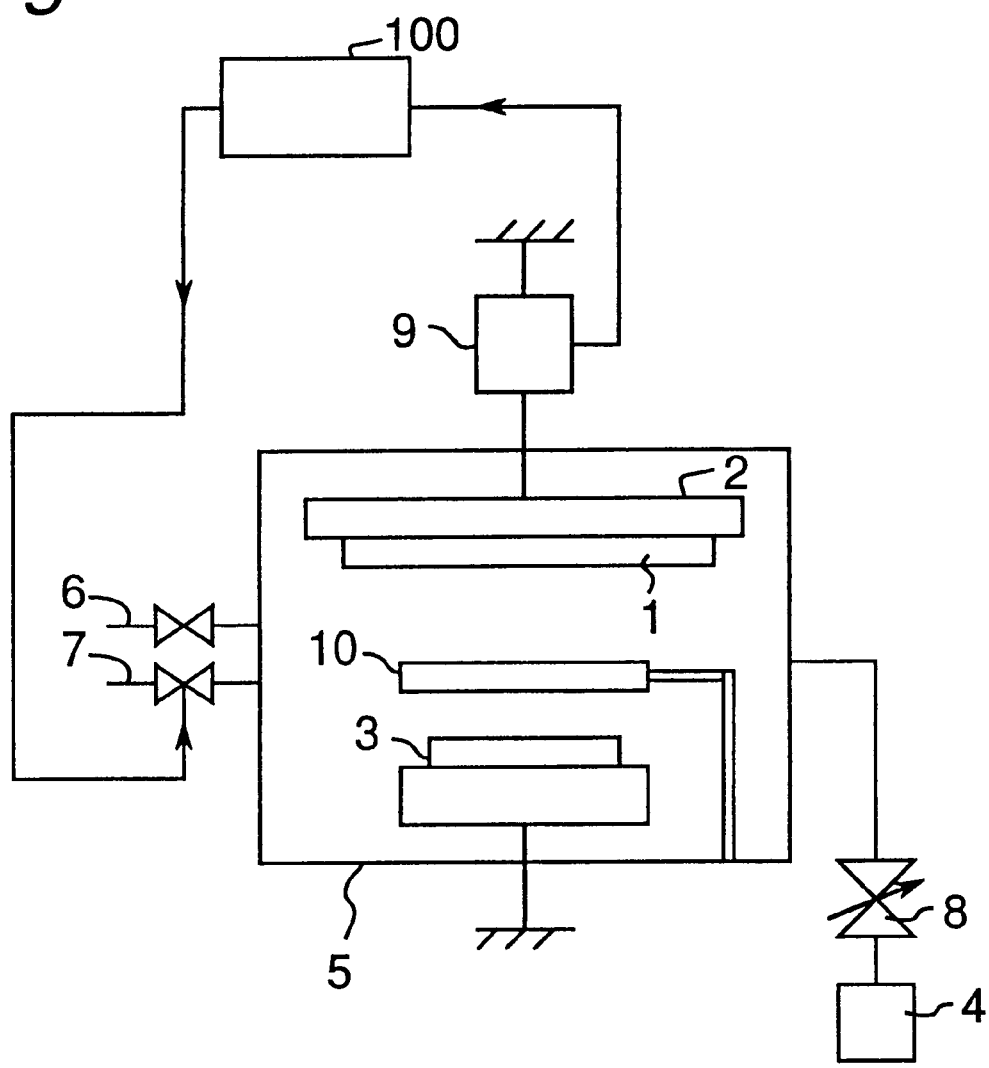
FIG. 3 is a schematic diagram of an apparatus for executing a sputtering method according to a second embodiment of the present invention.

A sputtering apparatus for executing a sputtering method according to a second embodiment of the present invention is shown in FIG. 3. While a photo-detector or the like is used in the first embodiment as an example of the discharge detection sensor 101 for detecting the timing of the start of the discharge, a discharge power is detected instead according to the second embodiment. Specifically, a power value of the direct current power source or high frequency power source 9 is input to the control device 100, and it is judged as the timing of the discharge start when the input value becomes a predetermined value not larger than the discharge power thereby to close the trigger gas feed system 7 of the opened state. The predetermined value is determined based on data obtained by measuring the power value beforehand when the discharge is generated. For instance, in the timing chart of FIG. 2, 2.5 kW smaller than the discharge power 5 kW is set to be the predetermined value. The trigger gas feed system 7 is closed by the control device 100 when the power value is detected to be 2.5 kW. The second embodiment exerts the same effect and operation as the first embodiment, so that the thickness of the film formed on the substrate 3 is stabilized more.

A signal indicating that a discharge power source is turned ON may be input to the control device 100. In this case, the trigger gas feed system 7 may be shut by the control device 100 based on the signal. This example alike operates schematically the same effect.

Although a shutter is not installed between the cathode 2 and the substrate 3 in the first embodiment, the sputtering apparatus in the second embodiment is provided with a shutter 10, as shown in FIG. 3, to shut the cathode 2 from the substrate 3 when the substrate 3 is transferred. The same effect as in the first embodiment is achieved also in the arrangement.

Figure 4:
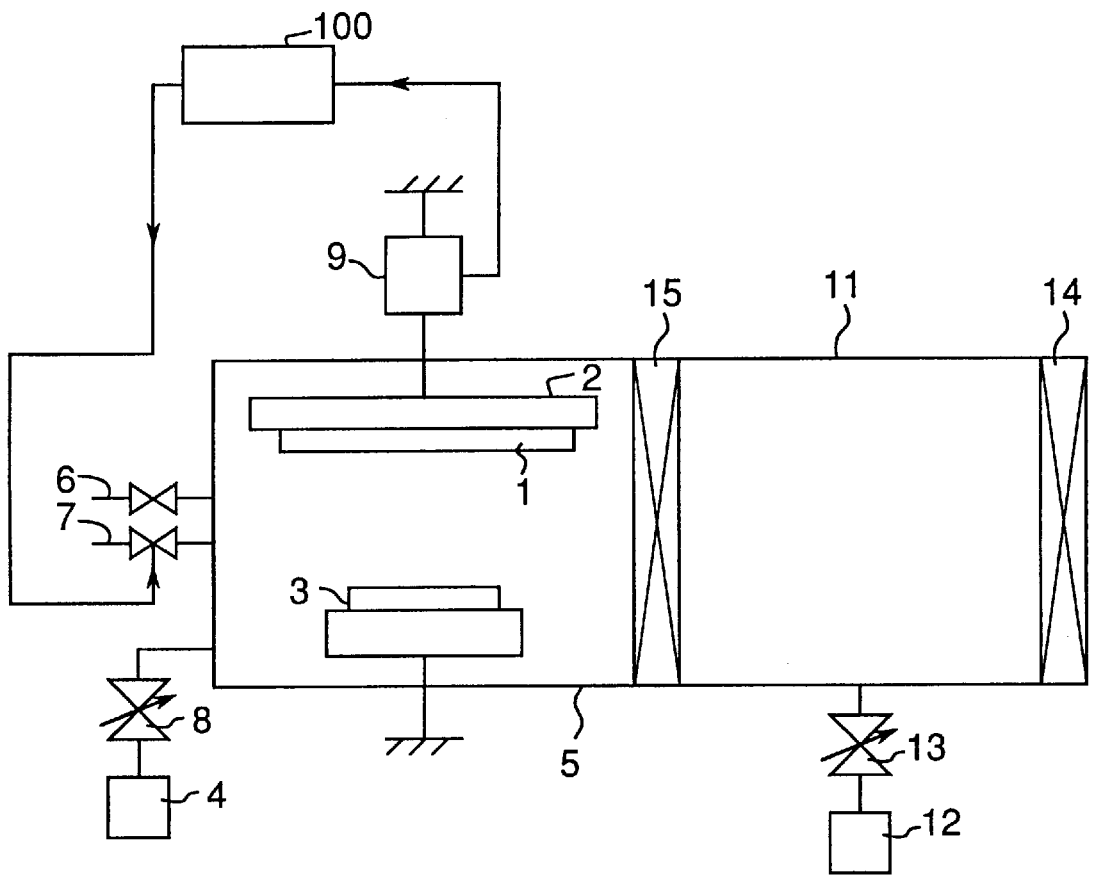
FIG. 4 is a schematic diagram of an apparatus for executing a sputtering method according to a third embodiment of the present invention.

In a sputtering apparatus according to a third embodiment in FIG. 4, a reserve chamber or transfer chamber 11 is arranged adjacent to the vacuum chamber 5. A gate valve 15 is disposed at an end of the reserve chamber or transfer chamber 11 adjoining the vacuum chamber 5, and another gate valve 14 is set at the other end of the chamber 11. In the arrangement, the gate valve 14 is opened/closed when the substrate 3 is transferred into the reserve or transfer chamber from outside of the apparatus, while the gate valve 15 is opened/closed when the substrate in the reserve or transfer chamber 11 is sent to the vacuum chamber 5.

Figure 5:
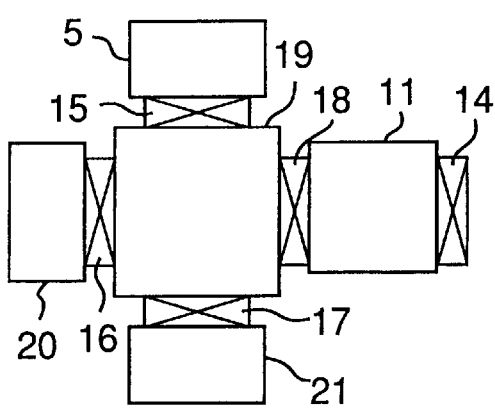
FIG. 5 is a schematic diagram of an apparatus for executing a sputtering method according to a fourth embodiment of the present invention.
Figure 6:
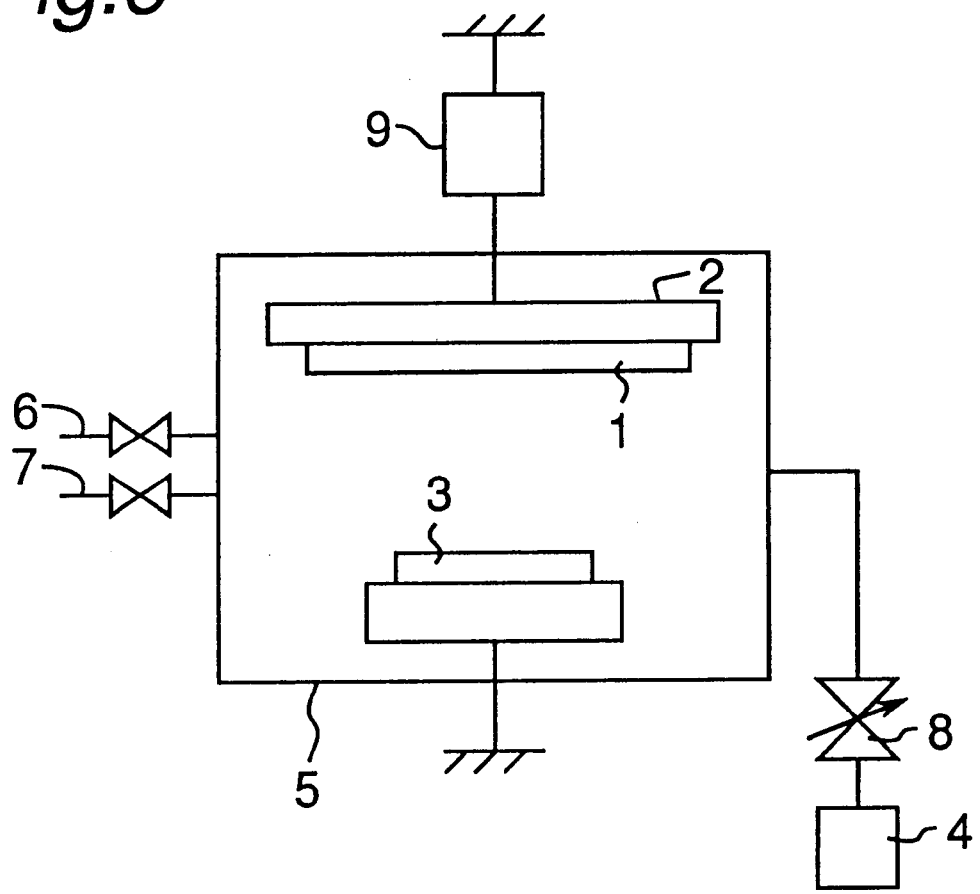
FIG. 6 is a schematic diagram of an apparatus for executing a conventional sputtering method.
Figure 7:
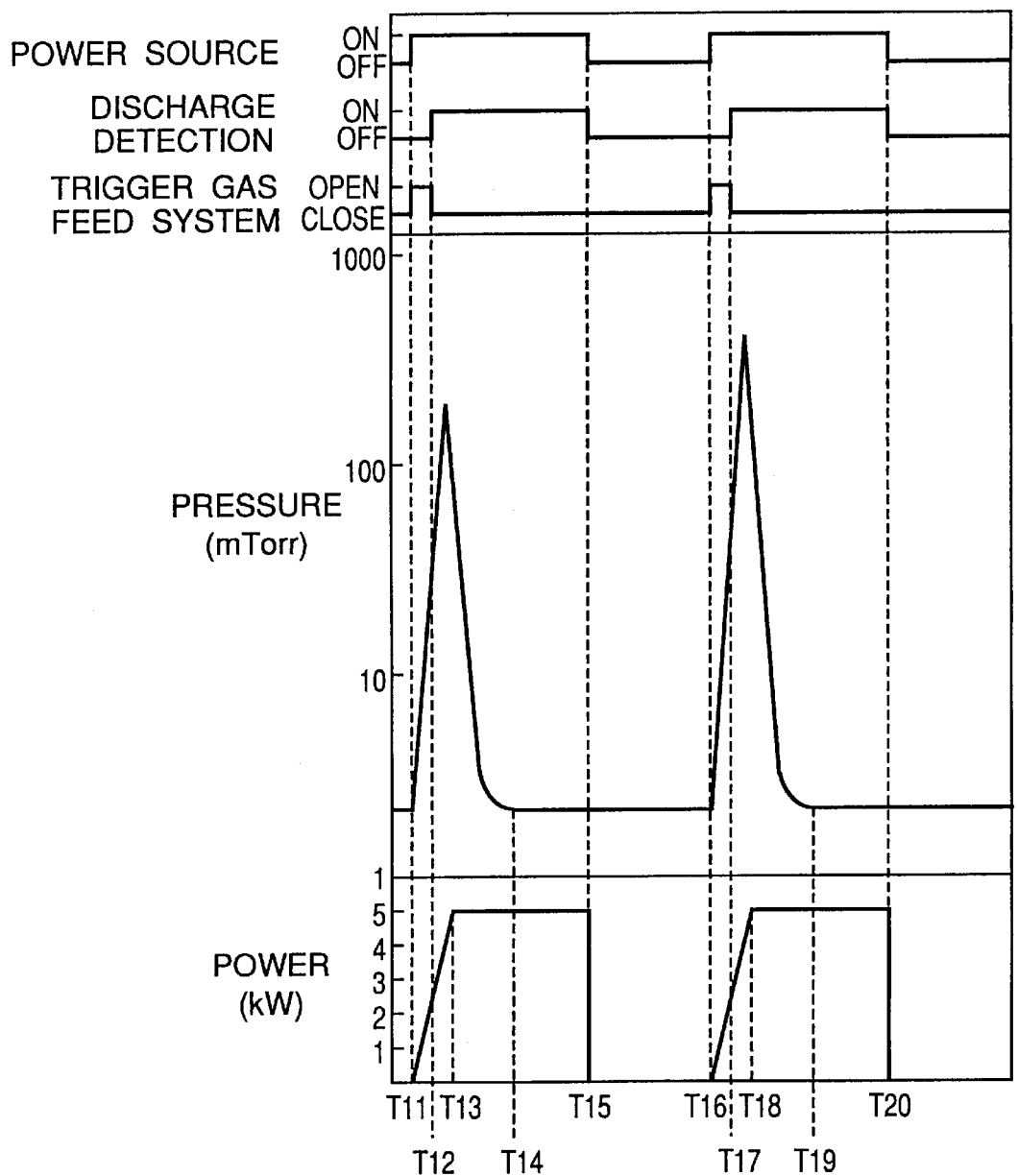
FIG. 7 is a timing chart of a sputtering process in the sputtering method of FIG. 6.

FIG. 5 illustrates a sputtering apparatus according to a fourth embodiment. The sputtering apparatus has a first through a third reaction chambers 5, 20, 21 in addition to the reserve chamber 11 in the periphery of a transfer chamber 19, with gate valves 18, 15, 16, 17 interposed between the transfer chamber 19 and reserve chamber 11 and between the transfer chamber 19 and each reaction chamber 5, 20, 21. The second, third reaction chamber 20, 21 is in the same structure as the earlier-described vacuum chamber 5. A plurality of substrates 3 can be subjected to sputtering in the plurality of reaction chambers 5, 20, 21 at the same time. Moreover, the gate valve 14 is arranged outside the reserve chamber 11. Each gate valve 15, 16, 17, 18 is opened/closed when the substrate 3 is delivered between each of the transfer chamber 19, reaction chamber 5, 20, 21, reserve chamber 11 and the outside of the chamber. Therefore, an atmosphere inside each chamber is shut as much as possible from that outside the chamber, making it possible to maintain the internal atmosphere constant.

While the reserve or transfer chamber is provided in any of the foregoing embodiments, the present invention can be executed without the reserve or transfer chamber.

Similarly, the present invention can be carried out without the pressure regulation valve 8 although it is provided in the foregoing embodiments.

According to the embodiments of the present invention as described hereinabove, in principle, the trigger gas feed system is opened except during the discharge. The collection or stagnation of the gas is consequently eliminated in the trigger gas feed system, holding the pressure in the vacuum chamber before the start of the discharge always constant. Moreover, the pressure in the vacuum chamber before the discharge while the trigger gas feed system is opened is decreased to be as low as the limit discharge pressure, and therefore the time for the vacuum chamber to return to the sputtering pressure is reduced. Owing to this, the timing of the start of the discharge is stabilized thereby to stabilize the film formation time. At the same time, the time to return to the sputtering pressure is shortened thereby to stabilize the sputtering pressure at the film formation occasion, thus stabilizing the film thickness and film quality. Further, the quality of the film at the interface to the substrate is stabilized, the thickness of the film formed with the higher pressure than the sputtering pressure is reduced, and the film formation speed is improved.

The entire disclosure of Japanese Patent Application No. 8-226512 filed on Aug. 28, 1996, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A sputtering method comprising:
   opening a trigger gas feed system to increase a flow rate of a discharge gas into a vacuum chamber and to attain a constant pressure in said vacuum chamber immediately before a sputtering discharge is detected, said constant pressure being greater than a sputtering pressure;
   closing said trigger gas feed system when said sputtering discharge is detected whereby said vacuum chamber attains said sputtering pressure; and
   re-opening said trigger gas feed system after said sputtering discharge is extinguished.

2. The sputtering method of claim 1, wherein after said sputtering discharge is extinguished, said trigger gas feed system is re-opened and is maintained open until a second sputtering discharge is detected.

3. The sputtering method of claim 2, wherein said opening of said trigger gas feed system to increase said flow rate of said discharge gas into said vacuum chamber and to attain said stable constant pressure in said vacuum chamber comprises opening said trigger gas feed system before said sputtering discharge is ignited; and
   wherein said closing of said trigger gas feed system comprises closing said trigger gas feed system when said sputtering discharge is ignited.

4. The sputtering method of claim 2, wherein when said sputtering discharge is extinguished, a film formation on a substrate is complete.

5. The sputtering method of claim 4, further comprising removing said substrate when said sputtering discharge is extinguished.

6. The sputtering method of claim 1, wherein said opening of said trigger gas feed system to increase said flow rate of said discharge gas into said vacuum chamber and to attain said stable limit discharge pressure in said vacuum chamber comprises opening said trigger gas feed system before said sputtering discharge is ignited; and
   wherein said closing of said trigger gas feed system comprises closing said trigger gas feed system when said sputtering discharge is ignited.

7. A sputtering method comprising:
   providing a discharge power source connected to a cathode in a vacuum chamber;
   opening a trigger gas feed system to increase a flow rate of a discharge gas into said vacuum chamber and to attain a constant pressure in said vacuum chamber immediately before a power level of said discharge power source reaches a predetermined power level, said predetermined power level being less than or equal to a discharge power level, said constant pressure being greater than a sputtering pressure;
   closing said trigger gas feed system when said power level reaches said predetermined power level whereby said vacuum chamber attains said sputtering pressure; and
   re-opening said trigger gas feed system after a sputtering discharge is extinguished.

8. The sputtering method of claim 7, wherein after said sputtering discharge is extinguished, said trigger gas feed system is re-opened and is maintained open until said power level reaches said predetermined level.

9. The sputtering method of claim 8, wherein when said sputtering discharge is extinguished, a film formation on a substrate is complete.

10. The sputtering method of claim 9, further comprising removing said substrate when said sputtering discharge is extinguished.

11. The sputtering method of claim 7, wherein said opening of said trigger gas feed system to increase said flow rate of said discharge gas into said vacuum chamber and to attain said constant pressure in said vacuum chamber comprises opening said trigger gas feed system before said discharge power source is activated; and
    wherein said closing of said trigger gas feed system comprises closing said trigger gas feed system when said discharge power source is activated.

12. The sputtering method of claim 11, wherein after said sputtering discharge is extinguished, said trigger gas feed system is re-opened and is maintained open until said discharge power source is activated.

13. A sputtering apparatus comprising:
    a vacuum chamber;
    a trigger gas feed system for supplying a discharge gas into said vacuum chamber;
    a control device for opening and closing said trigger gas feed system;
    a discharge detection device for detecting a sputtering discharge in said vacuum chamber, said discharge detection device being connected to said control device;
    wherein said control device opens said trigger gas feed system to increase a flow rate of said discharge gas into said vacuum chamber and to attain a constant pressure in said vacuum chamber immediately before a sputtering discharge is detected, closes said trigger gas feed system when said sputtering discharge is detected whereby said vacuum chamber attains a sputtering pressure, and opens said trigger gas feed system after said sputtering discharge is extinguished; and
    wherein said limit discharge pressure is greater than said sputtering pressure.

14. The sputtering apparatus of claim 13, wherein said control device opens said trigger gas feed system after said sputtering discharge is extinguished and maintains said trigger gas feed system open until a second sputtering discharge is detected.

15. The sputtering apparatus of claim 13, wherein said control device opens said trigger gas feed system to increase said flow rate of said discharge gas into said vacuum chamber and to attain said stable constant pressure in said vacuum chamber before said sputtering discharge is ignited, and closes said trigger gas feed system when said sputtering discharge is ignited whereby said vacuum chamber attains said sputtering pressure.

16. The sputtering apparatus of claim 15, wherein said control device opens said trigger gas feed system after said sputtering discharge is extinguished and maintains said trigger gas feed system open until a second sputtering discharge is ignited.

17. A sputtering apparatus comprising:

a vacuum chamber;

a trigger gas feed system for supplying discharge gas into said vacuum chamber;

a control device for opening and closing said trigger gas feed system;

a cathode in said vacuum chamber;

a discharge power source connected to said cathode and to said control device;

wherein said control device opens said trigger gas feed system to increase a flow rate of a discharge gas into said vacuum chamber and to attain a constant pressure in said vacuum chamber immediately before a power level of said discharge power source reaches a predetermined power level, said predetermined power level being less than or equal to a discharge power level, closes said trigger gas feed system when said power level reaches said predetermined power level whereby said vacuum chamber attains a sputtering pressure, and opens said trigger gas feed system after a sputtering discharge is extinguished; and wherein said constant is greater than said sputtering pressure.

18. The sputtering apparatus of claim 17, wherein said control device opens said trigger gas feed system after said sputtering discharge is extinguished and maintains said trigger gas feed system open until said power level reaches said predetermined power level.

19. The sputtering apparatus of claim 17, wherein said control device opens said trigger gas feed system to increase said flow rate of said discharge gas into said vacuum chamber and to attain said constant pressure in said vacuum chamber before said discharge power source is activated, and closes said trigger gas feed system when said discharge power source is activated whereby said vacuum chamber attains said sputtering pressure.

20. The sputtering apparatus of claim 19, wherein said control device opens said trigger gas feed system after said sputtering discharge is extinguished and maintains said trigger gas feed system open until said discharge power source is activated.

* * * * *

UNITED STATES PATENT AND TRADEMARK OFFICE
CERTIFICATE OF CORRECTION

PATENT NO.    : 6,080,286
DATED         : June 27, 2000
INVENTOR(S)   : Akira Okuda It is certified that error appears in the above-identified patent and that said Letters Patent is hereby corrected as shown below:

<u>Title page,</u>
Item [73], the name of the Assignee should be Matsushita Electric Industrial Co., Ltd.

Signed and Sealed this

Thirtieth Day of October, 2001

*Attest:*

*Nicholas P. Godici*

NICHOLAS P. GODICI
*Attesting Officer*     *Acting Director of the United States Patent and Trademark Office*